(12) United States Patent
Miller et al.

(10) Patent No.: US 6,432,832 B1
(45) Date of Patent: Aug. 13, 2002

(54) METHOD OF IMPROVING THE PROFILE ANGLE BETWEEN NARROW AND WIDE FEATURES

(75) Inventors: Alan J. Miller, Moraga; Yosias Melaku, Berkeley, both of CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/346,562

(22) Filed: Jun. 30, 1999

(51) Int. Cl.[7] .................... H01L 21/76; H01L 21/302
(52) U.S. Cl. .................... 438/713; 438/701; 438/717; 438/719; 438/724; 438/723; 438/725; 438/736; 438/737; 438/738; 438/740; 438/978
(58) Field of Search ............................ 438/700, 701, 438/713, 717, 719, 724, 723, 725, 736, 737, 738, 740, 744, 978

(56) References Cited

U.S. PATENT DOCUMENTS

| | | | | |
|---|---|---|---|---|
| 5,356,828 A | * | 10/1994 | Swan et al. ................ | 437/67 |
| 5,672,239 A | * | 9/1997 | DeOrnellas ............... | 156/625.1 |
| 5,801,083 A | | 9/1998 | Yu et al. .................. | 438/424 |
| 5,807,789 A | | 9/1998 | Chen et al. ............... | 438/714 |
| 5,817,567 A | | 10/1998 | Jang et al. ................ | 438/427 |
| 5,858,857 A | | 1/1999 | Ho ........................... | 438/424 |
| 5,882,982 A | * | 3/1999 | Zhen et al. ................ | 438/424 |
| 5,930,644 A | * | 7/1999 | Tsai et al. ................. | 438/424 |
| 5,945,352 A | * | 8/1999 | Chen et al. ............... | 438/713 |
| 5,989,977 A | * | 11/1999 | Wu ........................... | 438/431 |
| 6,013,547 A | * | 1/2000 | Liaw ......................... | 438/238 |
| 6,069,086 A | * | 5/2000 | Nallan et al. .............. | 438/706 |
| 6,074,569 A | * | 6/2000 | Kiziloglu et al. .......... | 216/62 |
| 6,090,697 A | * | 7/2000 | Xing et al. ................ | 438/618 |
| 6,103,592 A | * | 8/2000 | Levy et al. ................ | 438/424 |
| 6,107,158 A | * | 8/2000 | Zheng et al. .............. | 438/424 |
| 6,107,206 A | * | 8/2000 | Chao et al. ............... | 438/706 |
| 6,130,166 A | * | 10/2000 | Yeh ........................... | 438/710 |
| 6,132,631 A | * | 10/2000 | Nallan et al. .............. | 216/16 |
| 6,156,629 A | * | 12/2000 | Tao et al. .................. | 438/535 |

OTHER PUBLICATIONS

Jansen, et al., "A Survey on the Reactive Ion Etching of Silicon in Microtechnology", J Micromech. Microeng. 6 (1996) 14–28, p. 17.*

* cited by examiner

Primary Examiner—Randy Gulakowski
Assistant Examiner—Jiri Smetana
(74) Attorney, Agent, or Firm—Beyer Weaver & Thomas, LLP (57) ABSTRACT

A method of performing a shallow trench isolation etch in a silicon layer of a layer stack is disclosed. The layer stack includes a silicon layer being disposed below a pad oxide layer, the pad oxide being disposed below a nitride layer, and the nitride layer being disposed below a photoresist mask. The etching takes place in a plasma processing chamber. The method includes flowing a first etchant source gas into the plasma processing chamber, forming a first plasma from the first etchant source gas, and etching through the nitride layer with the first plasma. The method further includes flowing a second etchant source gas into the plasma processing chamber, forming a second plasma from the second etchant source gas, and substantially removing the photoresist mask with the second plasma, wherein a substantial portion of the photoresist mask is removed from above the nitride layer before the silicon layer. The method additionally includes flowing a third etchant source gas into the plasma processing chamber, forming a third plasma from the third etchant source gas, and etching through the pad oxide layer and substantially stopping on the silicon layer. The method also includes flowing a fourth etchant source gas into the plasma processing chamber, forming a fourth plasma from the fourth etchant source gas, and etching through the silicon layer with the fourth plasma, the etching forming a narrow feature and a wide feature in the silicon layer, and wherein a first profile angle of the narrow feature is substantially equal to a second profile angle of the wide feature.

35 Claims, 7 Drawing Sheets

METHOD OF IMPROVING THE PROFILE ANGLE BETWEEN NARROW AND WIDE FEATURES

BACKGROUND OF THE INVENTION

The present invention relates to the fabrication of semiconductor integrated circuits (IC's). More particularly, the present invention relates to methods and apparatuses for etching through an IC's layer stack to produce substantially similar profile angles between narrow and wide etched features.

During the manufacture of a semiconductor-based product, for example, a flat panel display or an integrated circuit, multiple deposition and/or etching steps may be employed. By way of example, one method of etching is plasma etching. In plasma etching, a plasma is formed from the ionization and dissociation of process gases. The positively charged ions are accelerated towards the substrate where they, in combination with neutral species, drive the etching reactions. In this manner, etched features such as vias, contacts, or trenches may be formed in the layers of the substrate.

Recently, shallow trench isolation (STI) has grown in popularity as a preferred method for forming a trench that can, among other applications, electrically isolate individual transistors in an integrated circuit. Electrical isolation is needed to prevent current leakage between two adjacent devices (e.g., transistors). Broadly speaking, conventional methods of producing a shallow trench isolation feature include: forming a hard mask (e.g., nitride and pad oxide) over the targeted trench layer, patterning a soft mask (e.g., photoresist) over the hard mask, etching the hard mask through the soft mask to form a patterned hard mask, and thereafter etching the trench layer (e.g., silicon) to form the shallow trench isolation feature. Subsequently, the soft mask is removed in a separate process (i.e., ashed, wet etched, etc.) and the shallow trench isolation feature is back filled with a dielectric material.

Figure 1A:
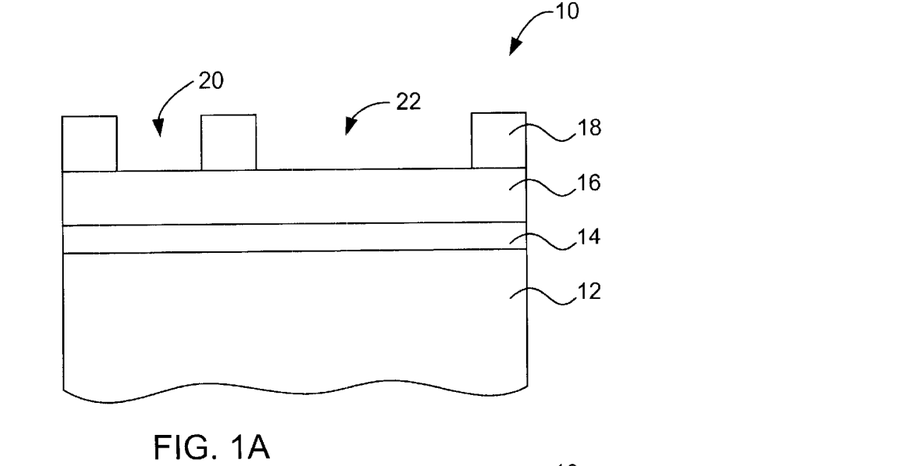
FIG. 1A illustrates a cross-sectional view of a layer stack, representing some of the layers formed during the fabrication of a shallow trench isolation.
Figure 1B:
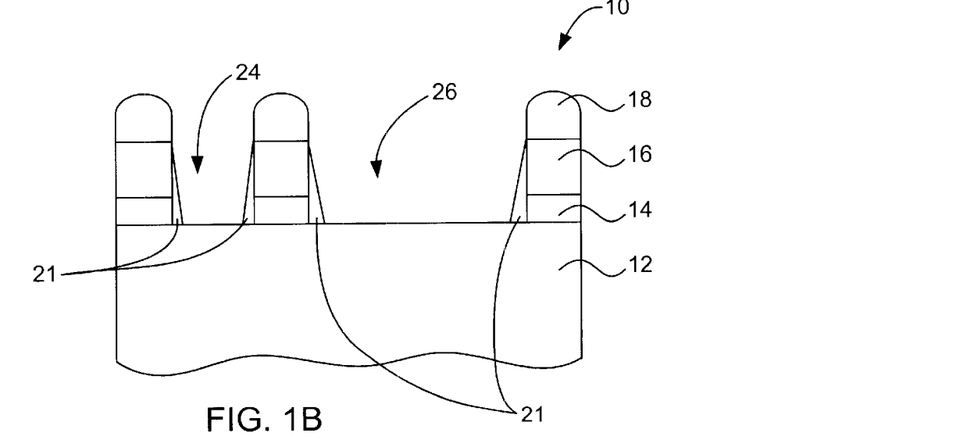
FIG. 1B shows the same layer stack of FIG. 1A after a hard mask has been etched through the nitride and pad oxide layers.
Figure 1C:
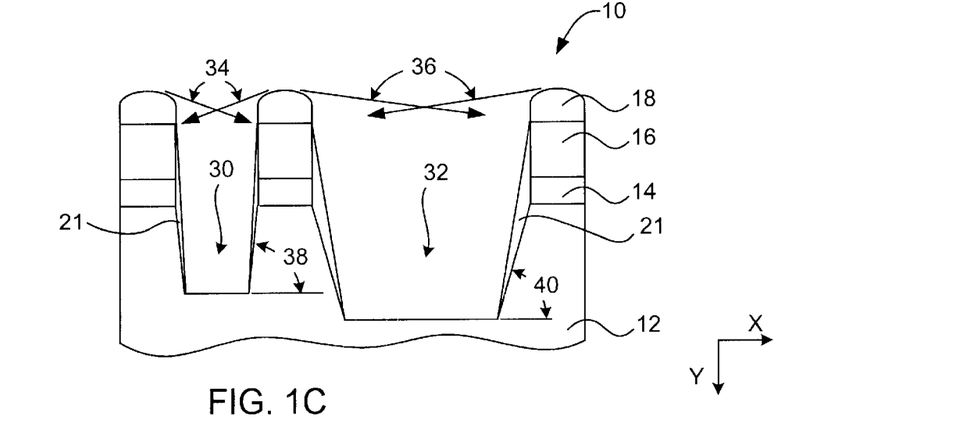
FIG. 1C depicts the same layer stack of FIG. 1A after a shallow trench isolation feature has been etched through the silicon layer.

FIGS. 1A–1C are cross section views of the conventional process steps that are used to form shallow trench isolation features. Referring initially to FIG. 1A, there is shown a typical layer stack 10 that is part of a substrate or semiconductor wafer. (not drawn to scale for ease of illustration). A silicon layer 12 is located at the bottom of layer stack 10. A pad oxide layer 14 is formed above silicon layer 12 and a nitride layer 16 is formed above pad oxide layer 14. In most situations, the pad oxide layer is used as the interlayer that is disposed between the nitride layer and the silicon layer. Furthermore, in order to create a patterned hard mask with pad oxide layer 14 and nitride layer 16, a photoresist layer 18 is deposited and patterned using a conventional photolithography step over nitride layer 16. After patterning, soft mask openings 20 (narrow) and 22 (wide) are created in photoresist layer 18 to facilitate subsequent etching. The above-described layers and features, as well as the processes involved in their creation, are well known to those skilled in the art.

Following the formation of layer stack 10, nitride layer 16 and pad oxide 14 are subsequently etched to create a hard mask, which includes a narrow hard mask opening 24 and a wide hard mask opening 26, as seen in FIG. 11B. The hard mask openings are used to pattern the trench during etching of the silicon layer. For the most part, etching stops after reaching silicon layer 12, however, a small portion on the surface of silicon layer 12 is typically etched away during the etching of pad oxide layer 14. Moreover, a gas chemistry that includes $CF_4$ is typically used to facilitate etching through the nitride and pad oxide layers. Typically, the $CF_4$ chemistry etches the side walls of narrow hard mask openings anisotropically (i.e., straight down). Correspondingly, the profile angle between the narrow hard mask opening and the wide hard mask opening tend to have limited angular variation. Moreover, photoresist layer 18 (e.g., soft mask) is partially eroded during the reaction (e.g., etching), as shown.

Furthermore, during etching, a passivating film 21 is typically built up along the side walls of the etched features. The passivating film is formed from the etch products of the etched layers (e.g., photoresist, nitride and pad oxide). Typically, when the etch products come off the surface being etched, they are re-energized in the plasma and as a result have a mean free path or trajectory wherein the etch products collide with surfaces inside the processing chamber. Because the carbon in the photoresist tends to contribute, or promote sticking of the chemical components, the etch products tend to stick to the first surface they come in contact with, where they form a deposit (e.g., passivating film).

Further still, because the line of sight of the etched products is greater on wide features than on narrow features more collisions typically will occur on the side walls of the wide features. By way of example, FIG. 1B shows a first line of sight 34 for the narrow feature and a second line of sight 36 for the wide feature. As shown, the line of sight of the narrow feature has a substantially smaller grouping of angles than the line of sight of the wide feature. Additionally, there is typically less etch byproducts per unit of vertical surface area in the narrow spaces relative to the wide spaces. As a result, passivating film 21 tends to be thicker on wide hard mask opening 26 than on narrow hard mask opening 24.

Once a hard mask opening is created through nitride layer 16 and pad oxide layer 14, silicon layer 12 is etched to form shallow trench isolation features, for example, a narrow feature 30 and a wide feature 32, as shown in FIG. 1C. Typically, a gas chemistry that includes $Cl_2$ and/or HBr is used to facilitate etching through the silicon layer.

Furthermore, during the silicon etch, narrow feature 30 forms a first profile angle 38 and wide feature 32 forms a second profile angle 40. The profile angle is measured as the angle formed by the etch side wall with a plane parallel to the top surface of the silicon layer. As a general rule, first profile angle 38 is typically closer to 90 degrees than second profile angle 40. While wishing not to be bound by theory, it is believed that the profile angles for the silicon trench are controlled to a significant degree by the deposition of etch products from the plasma. That is, the thicker the passivating film the more gradual the slope of the profile angle (i.e., less vertical). Therefore, because the wide features tend to have a thicker passivating film than the narrow features, the wide features will tend to have a less vertical slope than the narrow features. By way of example, the angular variation between the profile angles of the narrow and wide features may typically be between 8 and 12 degrees.

Moreover, it is contemplated that because the trenches are part of the active structure their relative profiles may have an influence on the behavior of the active structure. It is believed that, profile disparity between features may alter device performance, especially in logic type of devices. For example, it may alter the speed of electron flow, which will cause adverse timing issues. Additionally, it may effect subsequent processing steps such as CMP (e.g., due to leveling problems after back filling), which may contribute to problems in further steps.

Still further, in recent years, when designing features, the design criteria has been to design towards the narrow features and then apply that criteria to the wide features. However, to achieve greater circuit density, modern integrated circuits are scaled with increasingly narrower design rules. By way of example, it is not uncommon to employ design rules as small as 0.18 microns or even smaller in the fabrication of some high density integrated circuits. As the devices are packed closer together, it is important to minimize the angular difference between features as much as possible.

In a typical process flow, the substrate is taken out of the processing chamber after etching to remove the photoresist. Typically, the substrate is taken to a photoresist stripper that uses an $O_2$ etchant source gas to remove a substantial amount of the photoresist. The substrate may also be taken to a wet stripper where it is wet etched to remove any remaining photoresist, polymers and other unwanted deposits (e.g., side wall deposits or passivating films). These steps, although very useful in removing photoresist, create additional steps and machines that lead to adverse handling issues and a reduction in productivity.

In view of the forgoing there are desired improved methods and apparatuses for minimizing the profile angle difference between narrow and wide features. Also, desired are etch techniques that may be implemented "in situ," in other words, in one plasma processing chamber. Historically, trench features have been etched with a sequential process flow, where the silicon trench is etched in one chamber and the photoresist is removed in another chamber. A significant improvement in productivity can be achieved if the trench etch and photoresist removal are performed in situ (in the same chamber).

SUMMARY OF THE INVENTION

The invention relates, in one embodiment, to a method of performing a shallow trench isolation etch in a silicon layer. The silicon layer being disposed below a pad oxide layer. The pad oxide being disposed below a nitride layer. The nitride layer being disposed below a photoresist mask. The shallow trench isolation etch taking place in a plasma processing chamber. The method includes flowing a first etchant source gas into the plasma processing chamber, forming a first plasma from the first etchant source gas, and etching through the nitride layer with the first plasma.

The method further includes flowing a second etchant source gas into the plasma processing chamber, forming a second plasma from the second etchant source gas, and substantially removing the photoresist mask with the second plasma, wherein a substantial portion of the photoresist mask is removed from above the nitride layer before the silicon layer. The method additionally includes flowing a third etchant source gas into the plasma processing chamber, forming a third plasma from the third etchant source gas, and etching through the pad oxide layer and substantially stopping on the silicon layer. The method also includes flowing a fourth etchant source gas into the plasma processing chamber, forming a fourth plasma from the fourth etchant source gas, and etching through the silicon layer with the fourth plasma. The etching forming a narrow feature and a wide feature in the silicon layer wherein a first profile angle of the narrow feature is substantially equal to a second profile angle of the wide feature.

The invention relates, in another embodiment, to a method of etching a feature in a target layer. The target layer being disposed underneath a hard mask layer. The hard mask layer being disposed underneath a soft mask. The etching taking place in a plasma processing chamber. The method includes flowing a first etchant source gas. into the plasma processing chamber, forming a first plasma from the first etchant source gas. The first plasma being configured for etching through at least a first portion of the hard mask layer to form a hard mask and etching substantially through the at least first portion of the hard mask layer with the first plasma to form the hard mask. The method further includes flowing a second etchant source gas into the plasma processing chamber, thereafter forming a second plasma from the second etchant source gas. The second plasma being configured for substantially removing soft mask and thereafter substantially removing the soft mask with the second plasma before etching the feature in the target layer.

The invention relates, in another embodiment, to a method of performing a shallow trench isolation etch in a silicon layer. The silicon layer being disposed below a pad oxide layer. The pad oxide being disposed below a nitride layer. The nitride layer being disposed below a photoresist mask. The shallow trench isolation etch taking place in a plasma processing chamber. The method includes flowing a first etchant source gas into the plasma processing chamber, forming a first plasma from the first etchant source gas and etching through the nitride layer with the first plasma. The method additionally includes flowing a second etchant source gas into the plasma processing chamber, forming a second plasma from the second etchant source gas and substantially removing the photoresist mask with the second plasma wherein a substantial portion of the photoresist mask is removed from above the nitride layer before the silicon layer.

BRIEF DESCRIPTION OF THE DRAWINGS

The present invention is illustrated by way of example, and not by way of limitation, in the figures of the accompanying drawings and in which like reference numerals refer to similar elements and in which.

4B shows the same layer stack of FIG. 4A after a hard mask has been etched through the TEOS oxide layer, according to one embodiment of the present invention.

DETAILED DESCRIPTION OF PREFERRED EMBODIMENTS

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

By way of example, the typical process sequence for in situ mask shallow trench etch is: nitride etch, pad oxide etch, silicon trench etch. For this sequence, the resist remains on the wafer through the trench etch. The presence of the photoresist during silicon etching can degrade some of the trench features, particularly for profile control between narrow and wide features. This is because, deposits created during etching bombard the side walls of the features from varying trajectories throughout the chamber. Correspondingly, because the wide features have a greater open area than the narrow features, more deposits are formed along the side walls of the wide feature. Adversely, this uneven deposition produces profile angle disparity between the wide and narrow features during subsequent process steps. The typical result for profile slope variation between narrow (e.g., dense lines) and wide features (e.g., open lines) is 8–12 degrees.

If the resist is stripped prior to the trench etch, the subsequent silicon etch becomes a hard mask trench etch and the profile slope variation between narrow and wide features can be controlled to 2–4 degrees. However, photoresist is typically stripped ex situ in the prior art. By adding an in situ resist strip step, in accordance with one aspect of the present invention, the productivity benefits of in situ mask open can be combined with the profile control benefits of hard mask trench etch.

While not wishing to be bound by theory, it is believed that by reducing the mask layer height before the silicon etch, particularly around the narrow feature, the trajectory angles of the polymer will be more closely matched between the wide and narrow features. That is, the deposition coming out of the plasma can see the side walls of the narrow feature more clearly. For this reason, it is desired to decrease a substantial portion of the photoresist height after the hard mask has been formed. By decreasing the height of the photoresist, the polymer will be deposited in a more even manner between the narrow and wide features. Additionally, by removing the photoresist before the silicon etch, the amount of polymer deposits forming on the side walls of the features will be greatly reduced.

In accordance with one aspect of the present invention, profile angle control between narrow and wide features in shallow trench isolation is achieved "in situ" by etching the nitride layer with a first etchant source gas chemistry and then substantially removing the photoresist mask layer above the nitride layer with a second etchant source chemistry in the same plasma processing chamber. The etching takes place while the substrate is disposed on a chuck within the plasma processing chamber. Typically, the first etchant source gas is flowed into the chamber, and the pressure is stabilized. After the pressure has been stabilized the plasma is ignited, thereby generating ions from the etchant source gas. Next the plasma is stabilized and the ions etch the nitride layer, substantially stopping on the pad oxide layer or shortly thereafter.

Following the nitride etch, the first etchant source gas is evacuated from the chamber and the second etchant source gas is flowed into the chamber. Preferably, a gas chemistry that is selective to the hard mask (e.g., the nitride and/or the pad oxide layer) and silicon is used. After the pressure has been stabilized, the plasma is ignited, thereby generating ions from the second etchant source gas. The ions etch the photoresist layer, thereby substantially reducing its height above the nitride layer.

Thereafter, the second etchant source gas is evacuated from the chamber and the third etchant source gas is flowed into the chamber. Preferably, a chemistry that is suitable for etching the pad oxide layer but is selective to silicon is used. The plasma is ignited, thereby generating ions to etch the pad oxide layer. During this etch step, a portion of the remaining photoresist will be eroded away or if the photoresist was completely removed during the previous step a portion of the nitride layer may be etched. As a result, the height of the masking structure may be further reduced before beginning the silicon etch.

Subsequent to the etching of the hard mask opening through the nitride and pad oxide layers, and the substantial removal of the photoresist (e.g., soft mask), the third etchant source gas is evacuated from the chamber and a fourth etchant source gas is flowed into the chamber. A plasma is ignited, to etch the silicon layer thereby the shallow trench isolation feature.

Advantageously, the inventive method reduces polymer deposition along the side walls of the etched features and creates a more similar line of sight for the etched by-products between narrow and wide features. As a result, the profile angles of the narrow and wide features are more equal. By way of example, the profile angle difference is about 2 to 4 degrees or even smaller in some cases.

In one embodiment, a first etchant source chemistry that includes a fluorocarbon (e.g., $CF_4$, $C_2F_6$ and/or $CHF_3$) is employed to etch through a nitride layer down to an underlying pad oxide layer. A second etchant source chemistry that includes $O_2$ is employed to substantially remove the photoresist layer. A third etchant source chemistry that includes a hydro-fluorocarbon (e.g., $CHF_3$, $CH_2F_2$, $CH_3F$, $CH_4$, $C_4F_8$, $C_2F_6$, and/or $C_2HF_5$) is employed to etch through the pad oxide layer down to an underlying silicon layer. A fourth etchant source chemistry that includes a chlorine (e.g., $Cl_2$) and/or bromine (e.g., HBr) is employed to etch through the silicon layer to form a shallow trench isolation feature.

Figure 2:
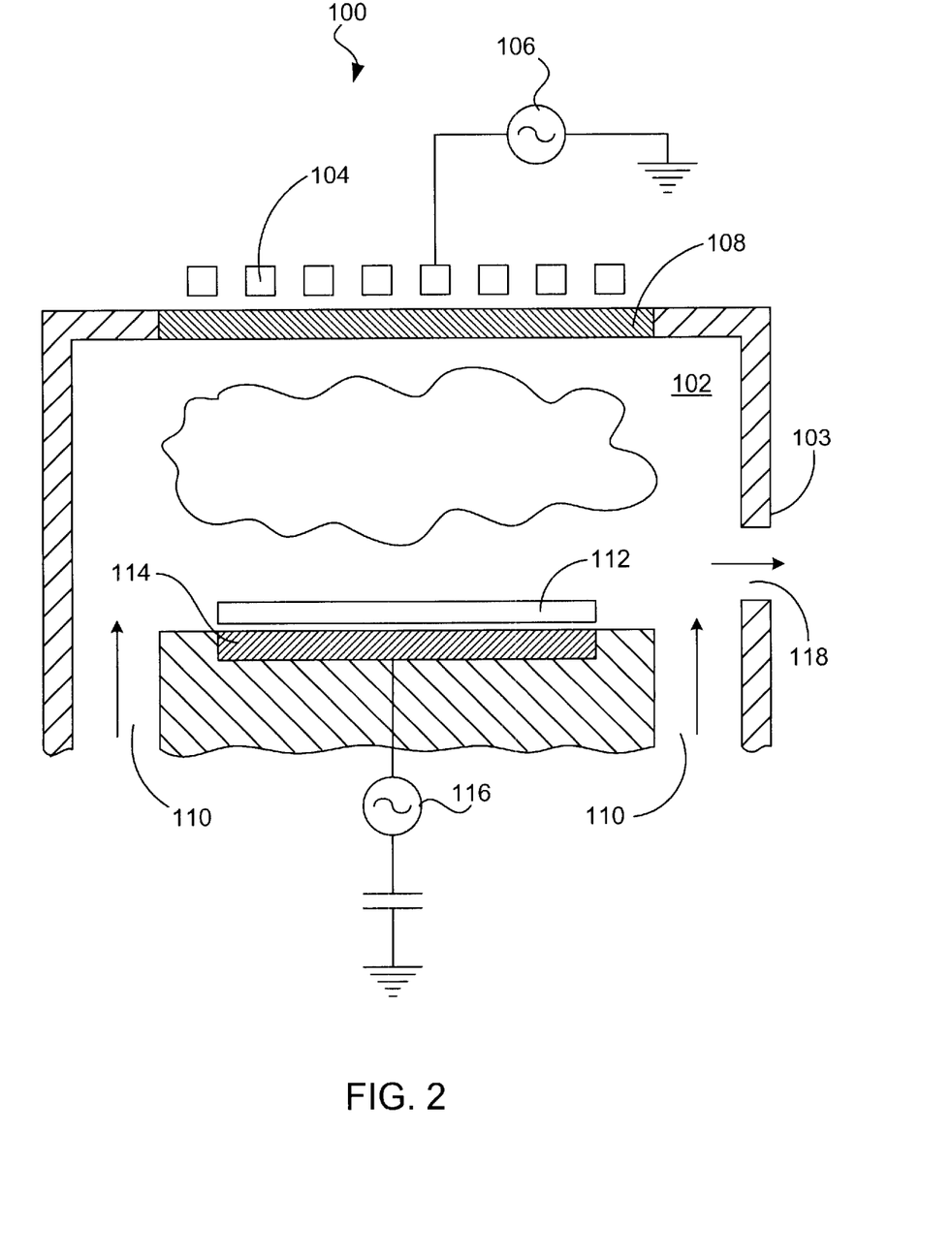
FIG. 2 is a simplified schematic diagram of a plasma reactor that may be suitably employed with the inventive etch process, according to one embodiment of the present invention.

In a preferred embodiment, the present invention is practiced in a high density plasma reactor, such as the inductively coupled TCP™ 9400 plasma reactor, which is available from Lam Research Corporation of Fremont, Calif. FIG. 2 illustrates a simplified schematic of the TCP™ 9400 plasma reactor. Plasma reactor 100 includes a plasma processing chamber 102 with a chamber wall 103. Chamber wall 103 is preferably made from anodized aluminum. To provide an electrical path to ground, the chamber wall of chamber 102 is typically grounded. Above chamber 102, there is disposed an inductive electrode 104 (represented by a coil). Inductive electrode 104 is powered by a first RF power source 106 via a matching network (not shown in FIG. 2 to simplify the illustration). Preferably, a dielectric window 108 is disposed below inductive electrode 104.

Typically, a gas port 110 is provided within chamber 102. Gas port 110 is preferably disposed around the inner periphery of chamber 102 and is arranged for releasing gaseous source materials, e.g., the etchant source gases, into the RF-induced plasma region between dielectric window 108 and a substrate 112. Alternatively, the gaseous source materials may also be released from ports built into the walls of the chamber itself or through a shower head arranged in the dielectric window. Substrate 112 is introduced into chamber 102 and disposed on a chuck 114, which acts as a bottom electrode and is preferably biased by a second RF power source 116 (also typically via a matching network). Chuck 114 may optionally include a focus ring (not shown to simplify illustration), preferably made from silicon oxide or a aluminum oxide ceramic, positioned around the bottom electrode. Chuck 114 may represent, for example, an ESC (electrostatic) chuck, which secures substrate 112 to the chuck's surface by electrostatic force.

Still referring to FIG. 2, an exhaust port 118 is typically disposed on one side of chamber 102. Exhaust port 118 is coupled to a turbomolecular pump (not shown), typically located outside of chamber 102. For the most part, the turbomolecular pump maintains the appropriate pressure inside chamber 102. Although, the high density, inductively coupled reactor is employed as the preferred apparatus for forming shallow trench isolation features and has shown particularly good results, any plasma reactor that is suitable for forming a plasma, such as a capacitively coupled reactor or wave excited reactor, e.g., ECR (microwave) or hellion resonator, may be used.

In accordance with one preferred embodiment of the present invention, an inventive etch process employing a first etch chemistry that includes $CF_4$, a second etch chemistry that includes $O_2$ and a third etch chemistry that includes $CHF_3$ and/or $CH_2F_2$ and a fourth etch chemistry that includes $Cl_2$ is employed to reduce the disparity in profile angles between wide and narrow features, while providing good depth uniformity.

Figure 3A:
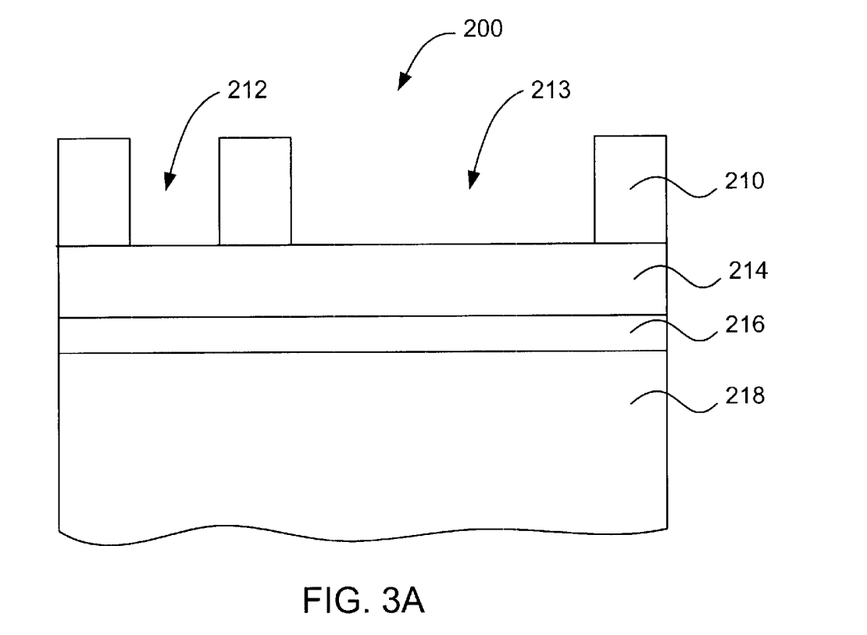
FIG. 3A illustrates a cross-sectional view of a layer stack, prior to being etched using the inventive etch process, according to one embodiment of the present invention.

FIG. 3A illustrates a typical layer stack 200 that may be etched with the inventive etch process to form a shallow trench isolation feature, in accordance with one embodiment of the present invention. A photoresist layer 210 implementing a soft mask with a patterned narrow mask opening 212 and wide mask opening 213 is disposed above a nitride layer 214. Nitride layer 214 is disposed above a pad oxide layer 216. Typically, the nitride layer and the pad oxide layer form a hard mask. The pad oxide layer is provided primarily for adhesion issues (e.g., nitride does not adhere very well to silicon). Furthermore, the nitride and pad oxide layers are typically sacrificial layers that are removed in subsequent processes and therefore the thickness of the nitride and pad oxide layers tend to vary. Pad oxide layer 216 is disposed above a silicon layer 218, as shown.

Figure 3B:
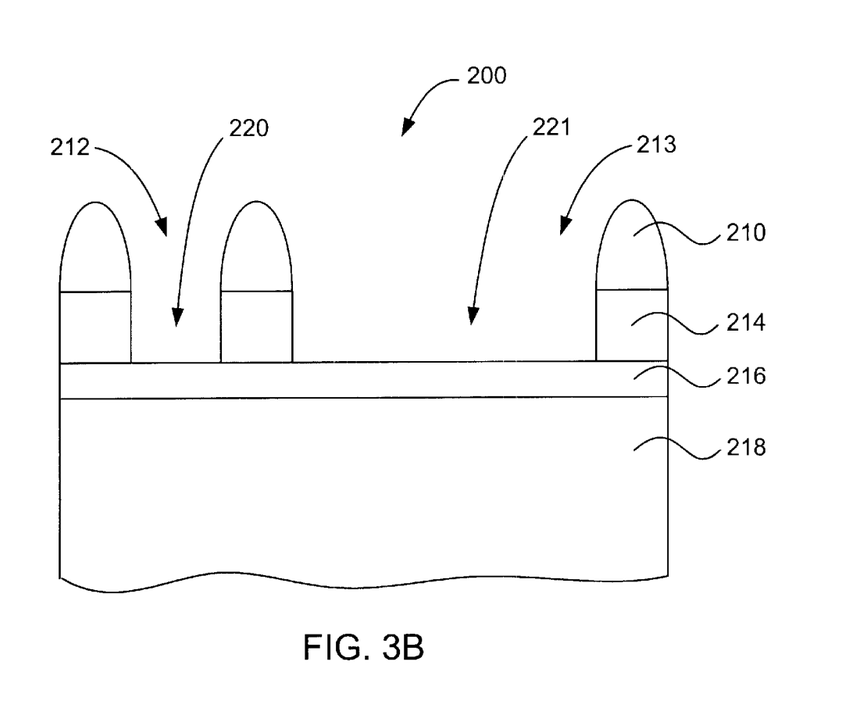
FIG. 3B shows the same layer stack of FIG. 3A after a hard mask has been etched through the nitride layer, according to one embodiment of the present invention.

FIG. 3B shows the layer stack 200 of FIG. 3A after etching nitride layer 214, in accordance with one embodiment of the present invention. Through patterned narrow opening 212 and wide mask opening 213, etchants formed by a plasma created with the $CF_4$-based etchant source gas react with the material of nitride layer 214 to form an etched feature in nitride layer 214. During this etching process, the plasma tends to anisotropically etch a narrow nitride opening 220 and a wide nitride opening 221. The plasma also tends to erode away some of photoresist layer 210 from an initial thickness. Etching with the first etchant source gas may be substantially stopped on pad oxide layer 216, as shown.

Figure 3C:
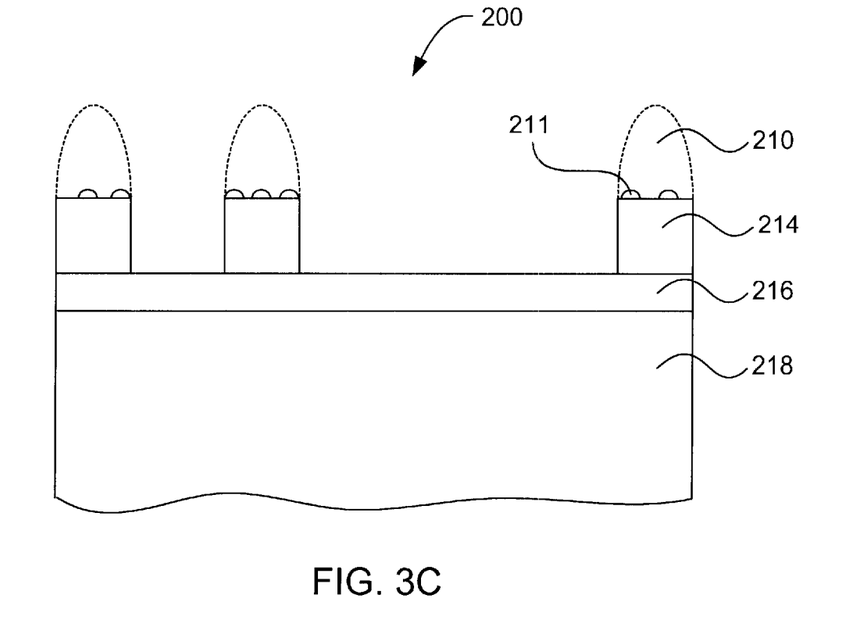
FIG. 3C shows the same layer stack of FIG. 3A after the photoresist mask has been removed using the inventive etch process, according to one embodiment of the present invention.

In accordance with one advantageous aspect of the present invention, once the nitride pattern is established, the photoresist layer is no longer needed to form the trench and therefore can be removed. FIG. 3C shows, in accordance with one embodiment of the present invention, the layer stack 200 of FIG. 3A after photoresist layer 210 (shown by the dotted line) is stripped, preferably in situ. During this step, etchants, formed by a plasma created with the $O_2$-based etchant source gas, react with the material of the photoresist layer 210 to substantially remove photoresist layer 210 from nitride layer 214. It should be noted that the removal of the resist need not be complete, the process may leave a residual photoresist layer 211 on the top of nitride layer 214 without significantly impacting the final results. Furthermore, by implementing the $O_2$ etch in situ, a handling step and a separate piece of equipment are not required in the process flow.

Figure 3D:
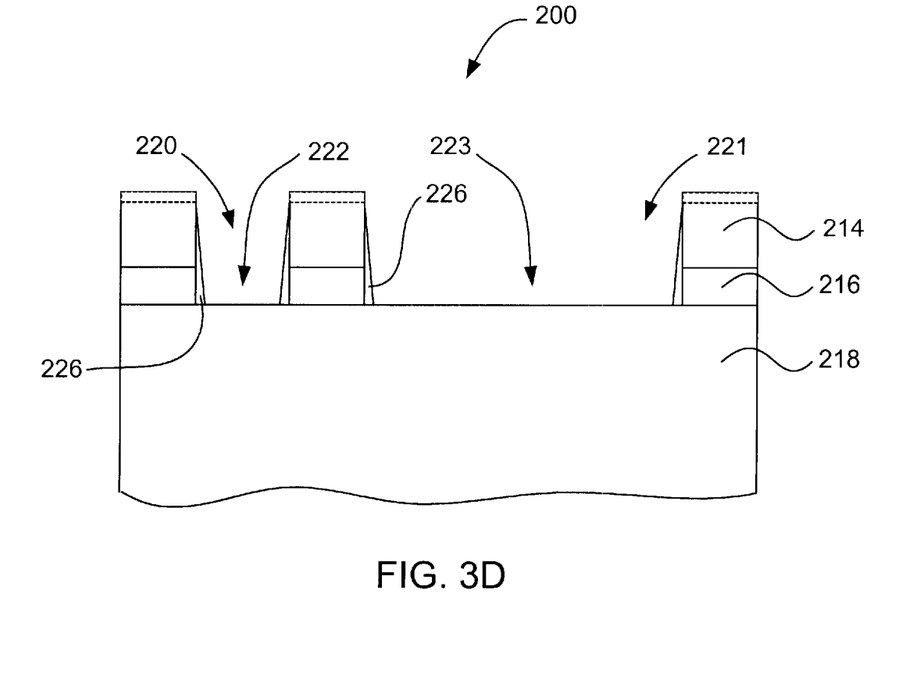
FIG. 3D shows the same layer stack of FIG. 3A after a hard mask has been etched through the pad oxide layer, according to one embodiment of the present invention.

FIG. 3D shows the layer stack 200 of FIG. 3A after etching pad oxide layer 216, in accordance with one embodiment of the present invention. Through the remaining photoresist layer 211 (if any), patterned nitride openings 220 and 221, etchants formed by a plasma created with the $CH_2F_2$ or $CHF_3$-based etchant source gas react with the material of the pad oxide layer 216 to form etched features in pad oxide layer 216. During this etching process, the plasma tends to anisotropically etch a narrow pad oxide opening 222 and a wide pad oxide opening 223. Any remaining photoresist may be substantially removed (e.g., eroded by the etch) and/or the height of the nitride layer may be reduced (as shown by the dotted lines) because the nitride layer now serves as the primary mask and is subject to more active etch bombardment. The reduction in height of the nitride layer tends to equalize the lines of sight in the narrow and wide spaces for subsequent etching steps. However, it should be noted that the nitride layer is typically needed for subsequent CMP steps and therefore a substantial portion should not be removed. a passivating film 226 may be formed along the side walls of oxide openings 222 and 223. Because the lines of sight are more equal in the narrow feature and the wide feature and because a substantial portion of the photoresist was removed before etching the pad oxide layer, passivating film 226 tends to be thinner and tends to have substantially the same thickness along the side walls of narrow pad oxide opening 222 and a wide pad oxide opening 223.

Figure 3E:
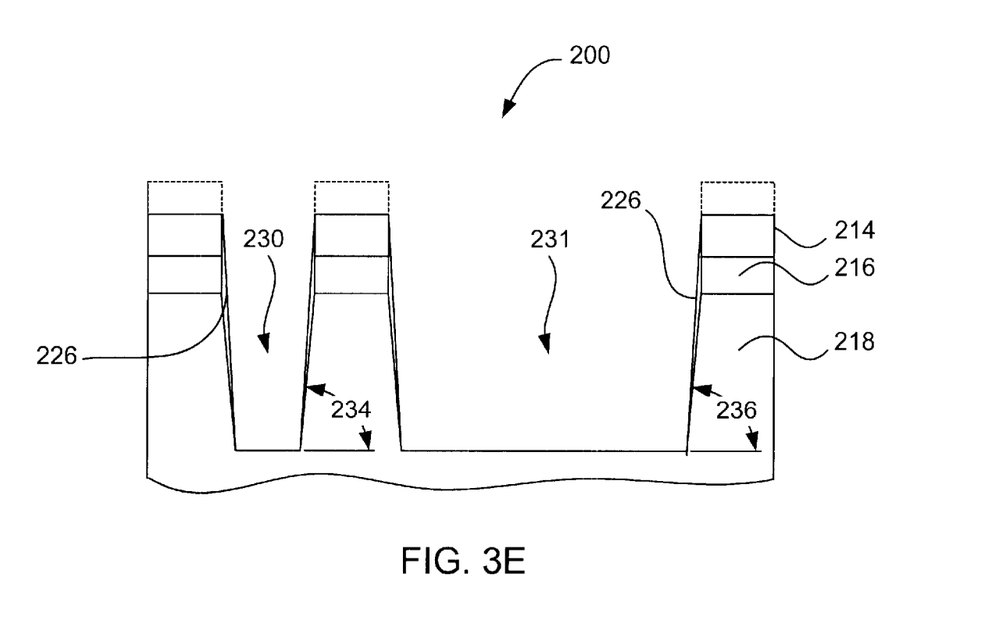
FIG. 3E shows the same layer stack of FIG. 3A after a shallow trench isolation feature has been etched through the silicon layer using the inventive etch process, according to one embodiment of the present invention.

FIG. 3E shows the layer stack 200 of FIG. 3A after etching silicon layer 218, in accordance with one embodiment of the present invention Through the mask openings, etchants formed by a plasma created with the $Cl_2$-based etchant source gas react with the material of the silicon layer 218 to form a narrow shallow trench isolation feature 230 and a wide shallow trench isolation feature 231 in silicon layer 218. The plasma also tends to erode away some of nitride layer 214, as shown by the dotted lines. Because of the earlier removal of the photoresist, this etching process tends to etch shallow trench isolation features 230 and 231 with more equal profile angles 234 and 236.

In one exemplary application of this invention, a 200 mm substrate having thereon an silicon layer (e.g., monocrystalline or epitaxcial), a pad oxide layer (e.g., $SiO_2$), and a nitride layer (e.g., $Si_3N_4$), is etched in the aforementioned TCP™ 9400 plasma processing system. The pad oxide has a thickness on the order of 100 angstroms (e.g., 80 to 150 angstroms). The nitride layer has a thickness on the order of 1200 angstroms (e.g., 1000 to 1800 angstroms). The thickness of the photoresist layer is typically between about 6,000 to 8,000 angstroms. The smallest trench has a feature size of 0.18 µm and the largest trench has a feature size of greater than 2.0 µm. However, it should be noted that this invention is not limited to a particular sized substrate, a particular feature size, a particular gas chemistry, a particular set of reactor parameters, a particular plasma processing system, or a particular layer thickness.

In this application, the nitride layer is etched using an etch process that employs the $CF_4$/HBr-based chemistry. The pressure within the aforementioned plasma processing reactor system is preferably maintained from about 5 milliTorr (mT) to about 50 mT, and preferably at about 10 mT during nitride etching. The top RF power is preferably maintained from about 200 watts (W) to about 800 W, and preferably at about 600 W. The bottom electrode power is preferably maintained from about 40 watts (W) to about 300 W, and preferably at about 120 W. flow rate of $CF_4$ is preferably from about 20 standard cubic centimeters per minute (sccm) to about 200 sccm, and preferably at about 100 sccm during etching. Preferably, the flow rate of $CF_4$ is between about 50% to 80% of the total flow. The flow rate of HBr is preferably from about 0 standard cubic centimeters per minute (sccm) to about 100 sccm, and preferably at about 50 sccm during etching. The ratio of the HBr flow rate to the $CF_4$ flow rate is preferably from about 0% to 75% and preferably at about 50%. It should be noted that the above chemistry may include $CHF_3$. The flow rate of $CHF_3$ may be as little as 0 standard cubic centimeters per minute (sccm) to about 100 sccm or about 0% to about 100% of $CF_4$ flow. Furthermore, the etch source gas described above may also include a diluent gas, such as Argon at about 0% to about 100% of $CF_4$ flow.

The photoresist is removed using a plasma etch process that employs the 02 based chemistry. The pressure within the aforementioned plasma processing reactor system is preferably maintained from about 20 milliTorr (mT) to about 80 mT, and preferably at about 30 mT during photoresist removal. The top RF power is preferably maintained from about 300 watts (W) to about 900 W, and preferably at about 700 W. The bottom electrode power is preferably maintained at about 0 W. The flow rate of $O_2$ is preferably from about 20 standard cubic centimeters per minute (sccm) to about 500 sccm, and preferably at about 200 sccm . Preferably, the flow rate of $O_2$ is substantially 100% of the total flow. Furthermore, the etch source gas described above may also include a fluorine gas (e.g., $CF_4$, $SF_6$, and/or $NF_3$) at about 0% to 10% of $O_2$ flow.

The pad oxide is etched using an etch process that employs the $CHF_3$/$CF_4$ based chemistry. It should be noted that $CH_2F_2$ may be interchangeable with $CHF_3$. The pressure within the aforementioned plasma processing reactor system is preferably maintained from about 5 milliTorr (mT) to about 70 mT, and preferably at about 10 mT during pad oxide etching. The top RF power is preferably maintained from about 200 watts (W) to about 800 W, and preferably at about 600 W. The bottom electrode power is preferably maintained from about 50 watts (W) to about 300 W, and preferably at about 200 W.

The flow rate of $CF_4$ is preferably from about 10 standard cubic centimeters per minute (sccm) to about 70 sccm, and preferably at about 25 sccm during etching. Preferably, the flow rate of $CF_4$ is between about 15% to 50% of the total flow. The rate of $CBF_3$ is preferably from about 20 standard cubic centimeters per minute (sccm) to about 100 sccm, and preferably at about 50 sccm during etching. The ratio of the $CHF_3$ flow rate to the $CF_4$ flow rate is preferably from about 100% to 500% and preferably at about 350%. It should be noted that the above chemistry may include $O_2$. The flow rate of $O_2$ may be as little as 0 standard cubic centimeters per minute (sccm) to about 20 sccm or about 0% to about 50% of $CF_4$ flow. Furthermore, the etch source gas described above may also include a diluent gas, such as Argon or Helium (e.g., 0–300 sccm or about 0% to about 1000% of $CF_4$ flow).

The silicon layer is etched using an etch process that employs the $Cl_2$/$O_2$/HBr-based chemistry. The pressure within the aforementioned plasma processing reactor system is preferably maintained from about 5 milliTorr (mT) to about 30 mT, and preferably at about 10 mT during silicon etching. The top RF power is preferably maintained from about 250 watts (W) to about 800 W, and preferably at about 450 W. The bottom electrode power is preferably maintained from about 80 watts (W) to about 300 W, and preferably at about 120 W.

The flow rate of $Cl_2$ is preferably from about 20 standard cubic centimeters per minute (sccm) to about 70 sccm, and preferably at about 35 sccm during etching. Preferably, the flow rate of $Cl_2$ is between about 10% to 40% of the total flow. The flow rate of $O_2$ is preferably from about 2 standard cubic centimeters per minute (sccm) to about 12 sccm, and preferably at about 8 sccm during etching. The ratio of the $O_2$ flow rate to the $Cl_2$ flow rate is preferably from about 10% to 30% and preferably at about 20%. The flow rate of HBr is preferably from about 100 standard cubic centimeters per minute (sccm) to about 200 sccm, and preferably at about 150 sccm during etching. The ratio of the HBr flow rate to the $Cl_2$ flow rate is preferably from about 130% to 600% and preferably at about 400%. Furthermore, the etch source gas described above may also include a diluent gas, such as Argon at about 0% to about 50% of the total flow.

It should be noted, however, that the flow rates of the component source gases may be scaled as needed when larger substrates are involved. Thus, while the relative flow rate among the various component gases (which may be expressed as a percentage of the $CF_4$ flow rate, for example) is important, the absolute flow rate for each component gas may be modified as needed to accommodate different substrate sizes.

In an alternate embodiment, the "in situ" process sequence may be altered with similar results to profile similarity. For example, the process sequence may involve etching the nitride layer and the pad oxide layer first, subsequently implementing the photoresist strip, and then completing the silicon etch. It should be understood that the photoresist may be removed anytime before etching of the targeted layer (e.g., silicon layer) with beneficial profile angle results, in accordance with one aspect of the present invention. In another embodiment, a top rounding step may be added to the inventive etch process to provide a feature with top rounded attributes. In this embodiment the process sequence would include: etching the nitride and pad oxide layers, subsequently implementing the photoresist strip, implementing the top rounding step, and then completing the silicon etch. Top rounding, in accordance with one embodiment, is described in greater detail in a commonly assigned, co-pending patent application entitled "METHOD OF ACHIEVING TOP ROUNDING AND UNIFORM ETCH DEPTHS WHILE ETCHING SHALLOW TRENCH ISOLATION FEATURES", which is filed on the same date herewith and incorporated by reference.

In yet another embodiment, the process sequence may include: a nitride etch "ex situ", followed by an "in situ" pad oxide etch, photoresist strip, top rounding step, and trench etch. Still further, an alternate process flow would be to etch the nitride layer in a separate chamber, stopping at the end point on the pad oxide layer to be followed by photoresist strip in the same chamber. The pad oxide could then be etched in situ with the trench etch, using the above mentioned chemistry.

In another preferred embodiment, the process sequence shown in FIGS. 3A–3E may be used in an analogous manner to form a polysilicon gate. Typically, a polysilicon gate is used to form a transistor in the semiconductor device. By way of example, the layers typically include a patterned photoresist layer (e.g., soft mask) that is disposed above a TEOS oxide layer (e.g. hard mask). The TEOS oxide layer is disposed above a silicon layer and the silicon layer is disposed above a gate oxide layer. Using the inventive steps, the TEOS oxide is etched to form a hard mask opening and then a substantial portion of the photoresist layer is removed. Following the removal of the photoresist, the silicon layer is etched down to the gate oxide layer. In the same manner as previously described, more equal profile angles are achieved between the narrow and wide features in the silicon layer. Alternatively, it should be noted that the TEOS oxide layer may be substituted by a nitride layer or a silicon oxy-nitride layer to form the hard mask, for example. By way of example, FIGS. 4A–4D illustrate the inventive process in conjunction with the formation of a polysilicon gate.

Figure 4A:
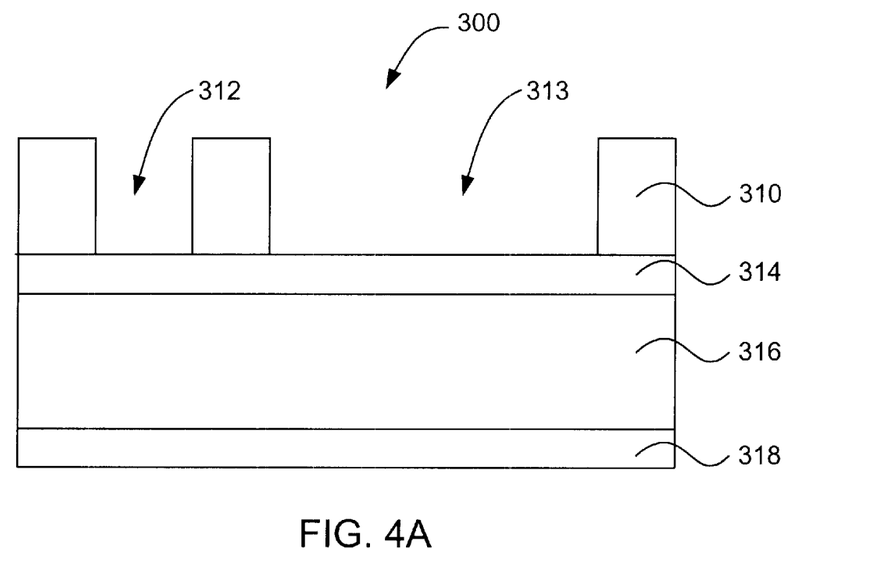
FIG. 4A illustrates a cross-sectional view of another layer stack, prior to being etched using the inventive etch process, according to one embodiment of the present invention.

FIG. 4A illustrates a typical layer stack 300 that may be etched with the inventive etch process to form polysilicon gates. A photoresist layer 310 with a patterned narrow mask opening 312 and wide mask opening 313 is disposed above a TEOS oxide layer 314. TEOS oxide layer 314 is disposed above a polycrystalline silicon layer 316 to be used as a hard mask. Furthermore, polycrystaline silicon layer 316 is disposed above a gate oxide layer 318.

Figure 4B:
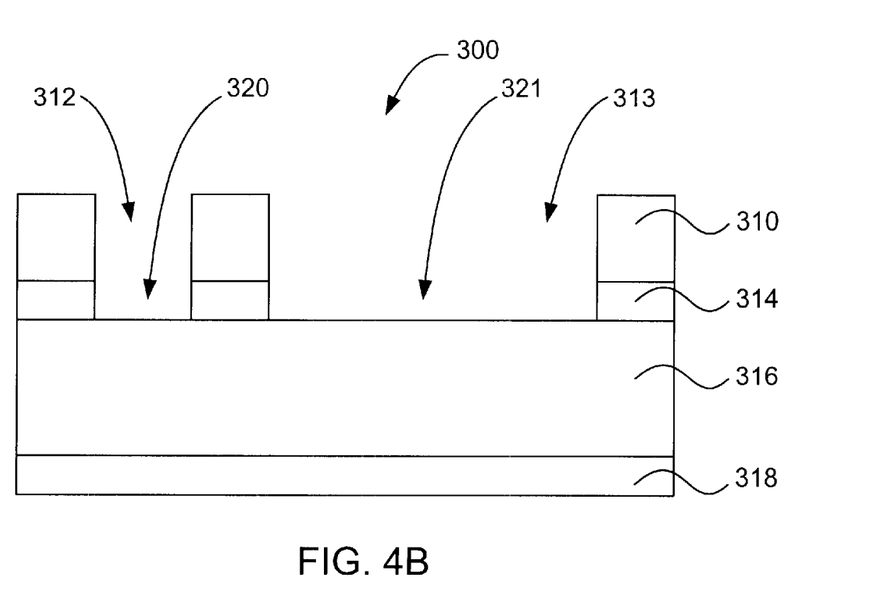

FIG. 4B shows the layer stack 300 of FIG. 4A after etching TEOS oxide layer 314 is etched typically with a $CF_4$, $CH_3$ and/or $CH_2F_2$ etchant source gas (e.g., and/or $CHF_3$ and/or $CH_2F_2$), in accordance with one aspect of the present invention. Through patterned mask openings 312 and 313, etchants (formed by a plasma created with the $CF_4$-based etchant source gas, for example) react with the material of TEOS oxide layer 314 to form etched features in TEOS oxide layer 314.

Figure 4C:
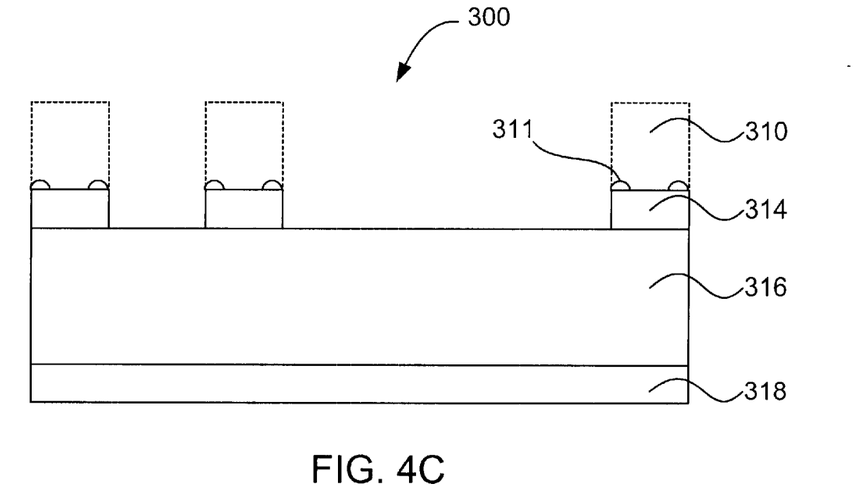
FIG. 4C shows the same layer stack of FIG. 4A after the photoresist mask has been removed using the inventive etch process, according to one embodiment of the present invention.

FIG. 4C shows the layer stack 300 of FIG. 4A after photoresist layer 310 is etched typically with an $O_2$-based etchant source gas, in accordance with one embodiment of the present invention. Once the TEOS oxide pattern is established, the photoresist layer may no longer be needed to form the trench. For the most part, etchants, formed by a plasma created with the $O_2$-based etchant source gas, react with the material of the photoresist layer 310 to substantially remove photoresist layer 310 from above TEOS oxide layer 314. It should be noted that the removal of the resist need not be complete, the process may leave a residual photoresist resist layer 311 on the top of TEOS oxide layer 314 without significantly impacting the final results.

Figure 4D:
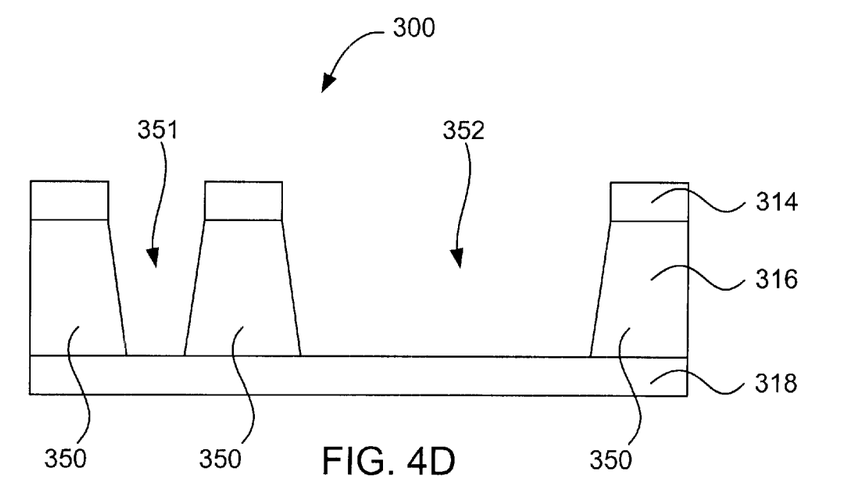
FIG. 4D shows the same layer stack of FIG. 4A after a feature has been etched through the silicon layer down to the gate oxide layer using the inventive etch process, according to one embodiment of the present invention.

FIG. 4D shows the layer stack 300 of FIG. 4A after etching silicon layer 316 is etched typically with HBr-based etchant source gas, in accordance with one aspect of the present invention. Through the patterned TEOS oxide layer mask openings 320 and 321, etchants (formed by a plasma created with the -based etchant source gas) react with the material of the silicon layer 316 to form polygate features 350. The etching process may stop on the gate oxide layer, as shown. substantial portion of the carbon (e.g., from the PR), the ability to stop on the gate oxide is enhanced without removing or etching too much of that layer.

In an alternative embodiment, the inventive etch process may be used in some metal etch applications. Typically, metal etching is used to form an interconnect in the semiconductor device. The metal stack layers may include a patterned photoresist layer (e.g., soft mask) that is disposed above a TEOS oxide layer (e.g. hard mask). The TEOS oxide layer is disposed above a metal layer. Using the inventive steps, the TEOS oxide is etched, in situ, to form a hard mask opening and then a substantial portion of the photoresist layer is removed. Following the removal of the photoresist, the metal layer is etched to form the interconnect. Advantageously, profile changes due to photoresist depletion during metal etching is avoided and the productivity benefit of in situ processing is obtained.

As can be seen from the foregoing, the present invention offers numerous advantages over the prior art. By way of example, removing the photoresist before etching the trench greatly serves to minimize the angular difference between narrow and wide features. Furthermore, the inventive technique eliminates a separate resist ashing step that is usually implemented subsequent to the trench etch, thereby enhancing substrate throughput and productivity. There is no longer a need to have a separate $O_2$ plasma resist strip step after the etching of the shallow trench. Therefore, the handling time of substrate transfer is reduced and the substrate can go directly from etching the trench to wet strip processing. Moreover, the inventive technique synergestically combines three different processes within the same reactor instead of using three separate machines.

Still further, the in situ photoresist strip advantageously removes the photoresist selectivity as a concern for the trench etch. That is, the risk of photoresist depletion in the trench etch, which typically effects passivation and therefore the feature profile angle, is eliminated.

While this invention has been described in terms of several preferred embodiments, there are alterations, permutations, and equivalents which fall within the scope of this invention. By way of example, although shallow trench isolation is employed to discuss the steps of the invention, the inventive technique for reducing the disparity in profile angles of the narrow and wide spaces may be employed on any other type of trench or via etches, whether or not in a silicon layer, where a hard mask is present above the target layer. Also, a BARC (bottom anti reflective coating) layer may be disposed between the nitride layer and the photoresist layer, for photolithography purposes. Typically, a BARC layer helps the transfer of critical dimensions of the photoresist onto the nitride (e.g., patterning). Furthermore, the thickness of the photoresist may be varied such that after etching the nitride, the photoresist is substantially removed by the bombardment of etchants in the first etchant source gas.

It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method of performing a shallow trench isolation etch in a silicon layer, said silicon layer being disposed below a pad oxide layer, said pad oxide being disposed below a nitride layer, said nitride layer being disposed below a photoresist mask, said method comprising:

flowing a first etchant source gas into said plasma processing chamber;

forming a first plasma from said first etchant source gas;

etching through said nitride layer with said first plasma;

flowing a second etchant source gas into said plasma processing chamber;

forming a second plasma from said second etchant source gas;

substantially removing said photoresist mask with said second plasma, wherein a substantial portion of said photoresist mask is removed from above said nitride layer before said silicon layer;

flowing a third etchant source gas into said plasma processing chamber;

forming a third plasma from said third etchant source gas;

etching through said pad oxide layer and substantially stopping on said silicon layer, wherein a portion of the nitride layer is etched during the pad oxide etch;

flowing a fourth etchant source gas into said plasma processing chamber;

forming a fourth plasma from said fourth etchant source gas; and etching through said silicon layer with said fourth plasma, said etching forming a narrow feature and a wide feature in said silicon layer, and wherein a first profile angle of said narrow feature is substantially equal to a second profile angle of said wide feature.

2. The method of claim 1 wherein said first etchant source gas includes a fluorocarbon.

3. The method of claim 1 wherein said second etchant source gas includes $O_2$.

4. The method of claim 1 wherein said third etchant source gas includes a hydro-fluorocarbon.

5. The method of claim 1 wherein the photoresist mask is completely removed from above said nitride layer before etching said silicon layer.

6. The method of claim 1 wherein a portion of the nitride layer is etched during the silicon etch.

7. The method of claim 1 wherein the plasma reactor is an inductively coupled plasma reactor.

8. The method of claim 1 wherein the step of removing said photoresist layer is performed in one step.

9. The method of claim 1 wherein the second etchant source gas is different than the first etchant source gas, wherein the third etchant source gas is different than the first and second etchant source gases and wherein the fourth etchant source gas is different than the first, second and third etchant source gases.

10. In a plasma processing chamber, a method of etching narrow and wide features in a target layer, said target layer being disposed underneath a hard mask layer, said hard mask layer being disposed underneath a soft mask, said soft mask having a narrow opening and a wide opening corresponding to said narrow and wide features, said method comprising:

flowing a first etchant source gas into said plasma processing chamber;

forming a first plasma from said first etchant source gas inside said plasma processing chamber, said first plasma being configured for etching through said hard mask layer;

etching at least a portion of said hard mask layer with said first plasma inside said plasma processing chamber to form a first opening and a second opening in said hard mask layer, said first opening corresponding to said narrow opening, said second opening corresponding to said wide opening;

thereafter flowing a second etchant source gas into said plasma processing chamber;

forming a second plasma from said second etchant source gas inside said plasma processing chamber, said second plasma being configured for substantially removing said soft mask; and substantially removing said soft mask with said second plasma inside said plasma processing chamber before etching said narrow and wide features in said target layer.

11. The method of claim 10 wherein said method further includes:

flowing a third etchant source gas into said plasma processing chamber after substantially removing said soft mask;

forming a third plasma from said third etchant source gas, said third plasma being configured for etching through at least a portion of said target layer to form said narrow and wide features; and etching substantially through said at least a portion of said target layer with said third plasma to form said narrow and wide features.

12. The method of claim 11 wherein said etching forms a shallow trench isolation feature.

13. The method of claim 11 wherein said etching forms a poly-silicon gate in a transistor device.

14. The method of claim 10 wherein said target layer is a silicon layer.

15. The method of claim 10 wherein said hard mask includes a nitride layer.

16. The method of claim 15 wherein said hard mask includes a pad oxide layer.

17. The method of claim 16 wherein said removing said soft mask occurs prior to etching through said pad oxide layer.

18. The method of claim 16 wherein said removing said soft mask occurs after etching through said pad oxide layer.

19. The method of claim 10 wherein said hard mask includes a TEOS oxide layer.

20. The method of claim 10 wherein said soft mask includes a photoresist layer.

21. The method of claim 10 wherein said hard mask includes a silicon layer.

22. The method of claim 10 wherein said soft mask includes a BARC layer.

23. The method of claim 10 wherein said target layer is a gate oxide layer.

24. An in situ method of etching openings in a layer stack inside a single process chamber, said layer stack including an underlying layer, a hard mask layer disposed above said underlying layer and a soft mask layer disposed above said hard mask layer, said soft mask layer having a narrow opening associated with a narrow feature and a wide opening associated with a wide feature, said method comprising:

performing a first process step inside said single process chamber, said first process step comprising etching said hard mask layer through the openings of said soft mask layer with a first set of chamber conditions so as to form a first opening corresponding to said narrow opening and a second opening corresponding to said wide opening in said hard mask layer; and thereafter performing a second process step inside said single process chamber, said second process step comprising removing at least a portion of said soft mask layer with a second set of chamber conditions that are different from the first set of chamber conditions so as to reduce the height of the soft mask layer before implementing processing steps related to forming said narrow and wide features in said underlying layer and to reduce the amount of deposits along the side walls of the first and second openings during subsequent processing steps.

25. The method as recited in claim 24 further comprising: performing a third process step inside said single process chamber, said third process step comprising etching said underlying layer through the openings of the hard mask layer with a third set of chamber conditions that are different from the first and second set of chamber conditions so as to form said narrow and wide feature in said underlying layer.

26. The method as recited in claim 25 wherein reducing the height of said soft mask layer and reducing the amount of deposits along the side walls serves to minimize the angular difference found between said narrow and wide features in said underlying layer.

27. The method as recited in claim 24 wherein said first process step comprises etching through a first portion of said hard mask layer, and wherein the method further includes performing a third process step inside said single process chamber, said third process step comprising etching through a second portion of said hard mask layer to said underlying layer with a third set of chamber conditions that is different than the second set of chamber conditions so as to complete the formation of said first and second openings through said hard mask layer.

28. The method as recited in claim 27 further comprising: performing a fourth process step inside said single process chamber, said fourth process step comprising etching said underlying layer with a fourth set of chamber conditions that are different from the first, second and third set of chamber conditions so as to form said narrow and wide features in said underlying layer.

29. The method as recited in claim 28 wherein the first set of chamber conditions comprises a gas chemistry of $CF_4$ and HBr, wherein the second set of chamber conditions comprises a gas chemistry of $O_2$, wherein the third set of chamber conditions comprises a gas chemistry of $CHF_3$ and $CF_4$, and wherein the fourth set of chamber conditions comprises a gas chemistry of $Cl_2$, $O_2$ and HBr.

30. In a plasma processing chamber, a method of performing a shallow trench isolation etch in a silicon layer, said silicon layer being disposed below a pad oxide layer, said pad oxide being disposed below a nitride layer, said nitride layer being disposed below a photoresist mask, said method comprising:

flowing a first etchant source gas into said plasma processing chamber;

forming a first plasma from said first etchant source gas;

etching through said nitride layer with said first plasma;

flowing a second etchant source gas into said plasma processing chamber;

forming a second plasma from said second etchant source gas;

substantially removing said photoresist mask with said second plasma, wherein a substantial portion of said photoresist mask is removed from above said nitride layer before said silicon layer;

flowing a third etchant source gas into said plasma processing chamber;

forming a third plasma from said third etchant source gas;

etching through said pad oxide layer and a portion of said silicon layer;

flowing a fourth etchant source gas into said plasma processing chamber;

forming a fourth plasma from said fourth etchant source gas; and etching through said silicon layer with said fourth plasma, said etching forming a narrow feature and a wide feature in said silicon layer, wherein said narrow feature has a first profile angle and said wide feature has a second profile angle, and wherein the difference between said first profile angle and said second profile angle is below about 4 degrees.

31. The method of claim 30 wherein the difference between said first profile angle and said second profile angle is about 2 to about 4 degrees.

32. In a plasma processing chamber, a method of performing a shallow trench isolation etch in a silicon layer, said silicon layer being disposed below a pad oxide layer, said pad oxide being disposed below a nitride layer, said nitride layer being disposed below a photoresist mask, said method comprising:

flowing a first etchant source gas into said plasma processing chamber;

forming a first plasma from said first etchant source gas;

etching through said nitride layer with said first plasma;

flowing a second etchant source gas into said plasma processing chamber;

forming a second plasma from said second etchant source gas;

substantially removing said photoresist mask with said second plasma, wherein a substantial portion of said photoresist mask is removed from above said nitride layer before said silicon layer;

flowing a third etchant source gas into said plasma processing chamber;

forming a third plasma from said third etchant source gas;

etching through said pad oxide layer and substantially stopping on said silicon layer;

flowing a fourth etchant source gas into said plasma processing chamber;

forming a fourth plasma from said fourth etchant source gas; and etching through said silicon layer with said fourth plasma, said etching forming a narrow feature and a wide feature in said silicon layer, wherein a portion of the nitride layer is etched during the silicon etch, and wherein a first profile angle of said narrow feature is substantially equal to a second profile angle of said wide feature.

33. The method of claim 32 wherein a portion of the nitride layer is etched during the pad oxide etch.

34. An in situ method for forming shallow trench isolation regions in a substrate comprising balancing the profile angles between narrow and wide features formed in an underlying layer by removing a mask layer having narrow and wide openings corresponding to said narrow and wide features before forming the narrow and wide features in the underlying layer.

35. A method for minimizing profile angle difference between a narrow and a wide feature in a target layer, said method comprising:

providing a mask layer over said target layer, said mask layer having a first portion and a second portion, said first portion forming a first narrow pattern associated with said narrow feature and a first wide pattern associated with said wide feature;

providing a single process chamber within which the following steps are implemented therein;

etching said mask layer to form a second narrow mask pattern and a second wide mask pattern in said second portion of said mask layer, said second narrow mask pattern corresponding to said first narrow mask pattern and said second wide mask pattern corresponding to said first wide mask pattern, said etching producing deposits that adhere to surfaces of said second narrow and wide mask patterns, said deposits having a component associated with said first portion of said mask layer;

decreasing a height of said mask layer in order maintain a more even distribution of said deposits on said surfaces of said second narrow and wide mask patterns; and etching said target layer through said second narrow and wide mask patterns to respectively form said narrow and wide features, said narrow feature having a first profile angle and said wide feature having a second profile angle, said first profile angle being similar to said second profile angle because of said height of said mask layer being decreased prior to, or during said etching of said target layer.

* * * * *